United States Patent
Satake et al.

(10) Patent No.: US 11,831,326 B2
(45) Date of Patent: Nov. 28, 2023

(54) ANALOG-TO-DIGITAL CONVERSION SYSTEM AND ANALOG-TO-DIGITAL CONVERSION METHOD

(71) Applicant: TOYOTA JIDOSHA KABUSHIKI KAISHA, Toyota (JP)

(72) Inventors: Takanori Satake, Toyokawa (JP); Yuzoh Yamauchi, Seto (JP); Satoshi Nishio, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/953,449

(22) Filed: Sep. 27, 2022

(65) Prior Publication Data

US 2023/0188154 A1    Jun. 15, 2023

(30) Foreign Application Priority Data

Dec. 15, 2021   (JP) ................. 2021-203208

(51) Int. Cl.
*H03M 1/36* (2006.01)
*H03M 1/10* (2006.01)
*H03M 1/06* (2006.01)
*H03M 1/38* (2006.01)

(52) U.S. Cl.
CPC .......... *H03M 1/361* (2013.01); *H03M 1/0609* (2013.01); *H03M 1/10* (2013.01); *H03M 1/1028* (2013.01); *H03M 1/36* (2013.01); *H03M 1/38* (2013.01)

(58) Field of Classification Search
CPC ...... H03M 1/361; H03M 1/36; H03M 1/1028; H03M 1/10; H03M 1/0609; H03M 1/38
See application file for complete search history.

(56) References Cited

U.S. PATENT DOCUMENTS

2018/0069565 A1   3/2018  Sugita
2019/0140576 A1 * 5/2019  Hata ..................... H02P 29/024

FOREIGN PATENT DOCUMENTS

| JP | 2013-102318 A | 5/2013 |
| JP | 2018-042082 A | 3/2018 |
| JP | 2019-054433 A | 4/2019 |

* cited by examiner

*Primary Examiner* — Joseph J Lauture
(74) *Attorney, Agent, or Firm* — Oliff PLC

(57) ABSTRACT

An analog-to-digital conversion system includes: a first conversion device configured to communicate with a first analog-to-digital converter configured to convert a first analog signal into a first digital signal; a second conversion device configured to communicate with a second analog-to-digital converter configured to convert a second analog signal into a second digital signal; a first reference low power supply; and a second reference low power supply. The first conversion device is configured to correct the first digital signal, based on a variation amount of a second reference low voltage or a second reference low current. The second conversion device is configured to correct the second digital signal, based on a variation amount of a first reference low voltage or a first reference low current.

6 Claims, 4 Drawing Sheets

ANALOG-TO-DIGITAL CONVERSION SYSTEM AND ANALOG-TO-DIGITAL CONVERSION METHOD

CROSS-REFERENCE TO RELATED APPLICATION

This application claims priority to Japanese Patent Application No. 2021-203208 filed on Dec. 15, 2021, incorporated herein by reference in its entirety.

BACKGROUND

1. Technical Field

The present disclosure relates to an analog-to-digital (A/D) conversion system and an A/D conversion method.

2. Description of Related Art

Japanese Unexamined Patent Application Publication No. 2019-54433 (JP 2019-54433 A) discloses a system in which a voltage output from the same sensor connected to a plurality of A/D converters is subjected to A/D conversion by using these A/D converters. In this system, the A/D converters have different reference voltages. The sensor includes a circuit for switching reference voltages to be used by the sensor.

In the system described above, one reference voltage is selected from among the reference voltages of the A/D converters, and a switching control command is output to the sensor. Based on the switching control command, the sensor controls the switching circuit so that the sensor operates at the same reference voltage as the reference voltage used by the selected A/D converter.

SUMMARY

In the system described above, however, the structure of the switching circuit and the control on the switching circuit are complicated. While the reference voltage used by the selected A/D converter is the same as the reference voltage of the sensor, the reference voltages used by the non-selected A/D converters are different from the reference voltage of the sensor. Therefore, when the A/D conversion by the non-selected A/D converter is performed in parallel with the A/D conversion by the selected A/D converter, it is difficult to secure the reliability of the value after the non-selected A/D conversion.

In the system described above, for example, the reference voltages of the A/D converters and the sensor are connected by wires. Therefore, the wires may serve as an antenna and noise may be mixed into the reference voltage of the sensor. Then, the detection accuracy of the sensor decreases. The value after the A/D conversion by the selected A/D converter causes a deviation from the true value. In the related-art system, a voltage divider circuit is provided in the sensor. Therefore, the input impedance of the A/D converter is limited to a low level by the voltage dividing resistance, and the deviation described above may occur when the output impedance of the sensor is high.

The present disclosure provides an A/D conversion system and an A/D conversion method that can secure the reliability of values after a plurality of A/D conversions by a plurality of A/D converters including different reference power supplies when these A/D converters are used to perform the A/D conversions in parallel.

An analog-to-digital conversion system according to a first aspect of the present disclosure is configured to perform a plurality of analog-to-digital conversions in parallel by using a plurality of analog-to-digital converters that include different reference voltages. The analog-to-digital conversion system includes: a first conversion device configured to communicate with a first analog-to-digital converter configured to convert a first analog signal into a first digital signal based on a first reference voltage or a first reference current; a second conversion device configured to communicate with a second analog-to-digital converter configured to convert a second analog signal into a second digital signal based on a second reference voltage or a second reference current; a first reference low power supply configured to input, to the second analog-to-digital converter, a first reference low voltage or a first reference low current lower than the first reference voltage or the first reference current; and a second reference low power supply configured to input, to the first analog-to-digital converter, a second reference low voltage or a second reference low current lower than the second reference voltage or the second reference current. The first reference voltage and the first reference current is output from a first reference power supply. The second reference voltage and the second reference current is output from a second reference power supply. The first conversion device is configured to correct the first digital signal, based on a variation amount of the second reference low voltage or the second reference low current. The second conversion device is configured to correct the second digital signal, based on a variation amount of the first reference low voltage or the first reference low current.

In the analog-to-digital conversion system according to the first aspect of the present disclosure, the first conversion device may be configured to correct the first digital signal to cancel the variation amount of the second reference low voltage or the second reference low current. The second conversion device may be configured to correct the second digital signal to cancel the variation amount of the first reference low voltage or the first reference low current.

In the analog-to-digital conversion system according to the first aspect of the present disclosure, the first digital signal may be corrected based on four arithmetic operations using a parameter related to the variation amount of the second reference low voltage or the second reference low current. The second digital signal may be corrected based on four arithmetic operations using a parameter related to the variation amount of the first reference low voltage or the first reference low current.

In the analog-to-digital conversion system according to the first aspect of the present disclosure, the first reference low power supply may be configured to generate the first reference low voltage or the first reference low current by stepping down the first reference voltage or the first reference current by using an active element or a passive element connected to the first reference power supply. The second reference low power supply may be configured to generate the second reference low voltage or the second reference low current by stepping down the second reference voltage or the second reference current of the second reference power supply by using an active element or a passive element connected to the second reference power supply.

In the analog-to-digital conversion system according to the first aspect of the present disclosure, the first reference voltage or the first reference current may be generated by amplifying the first reference low voltage or the first reference low current by using an active element connected to the first reference low power supply. The second reference voltage or the second reference current may be generated by amplifying the second reference low voltage or the second reference low current by using an active element connected to the second reference low power supply.

A second aspect of the present disclosure relates to an analog-to-digital conversion method for performing a plurality of analog-to-digital conversions in parallel by using a plurality of analog-to-digital converters that include different reference voltages. The analog-to-digital converters include a first analog-to-digital converter and a second analog-to-digital converter each configured to convert an analog signal into a digital signal. The analog-to-digital conversion method includes: correcting a second digital signal obtained by analog-to-digital conversion by the second analog-to-digital converter, based on a variation amount of a first reference low voltage or a first reference low current lower than a first reference voltage or a first reference current referred to during analog-to-digital conversion by the first analog-to-digital converter; and correcting a first digital signal obtained by the analog-to-digital conversion by the first analog-to-digital converter, based on a variation amount of a second reference low voltage or a second reference low current lower than a second reference voltage or a second reference current referred to during the analog-to-digital conversion by the second analog-to-digital converter.

With the first and second aspects, the second digital signal obtained by the analog-to-digital conversion by the second analog-to-digital converter is corrected based on the variation amount of the first reference low voltage or the first reference low current lower than the first reference voltage or the first reference current referred to during the analog-to-digital conversion by the first analog-to-digital converter. Further, the first digital signal obtained by the analog-to-digital conversion by the first analog-to-digital converter is corrected based on the variation amount of the second reference low voltage or the second reference low current lower than the second reference voltage or the second reference current referred to during the analog-to-digital conversion by the second analog-to-digital converter. Therefore, even in a case of variation in, for example, the second reference voltage or the second reference current referred to during the analog-to-digital conversion by the second analog-to-digital converter, a relative deviation in the values after the analog-to-digital conversion between the first analog-to-digital converter and the second analog-to-digital converter before and after the variation can be kept constant. Thus, it is possible to secure the reliability of the values after the analog-to-digital conversion by the first analog-to-digital converter and the second analog-to-digital converter.

With the first aspect, the first digital signal obtained by the analog-to-digital conversion by the first analog-to-digital converter is corrected to cancel the variation amount of the second reference low voltage or the second reference low current, and the second digital signal obtained by the analog-to-digital conversion by the second analog-to-digital converter is corrected to cancel the variation amount of the first reference low voltage or the first reference low current. Therefore, even in a case of variation in, for example, the second reference voltage or the second reference current referred to during the analog-to-digital conversion by the second analog-to-digital converter, the digital signal is corrected to cancel the variation amount. Thus, the relative deviation in the values after the analog-to-digital conversion between the first analog-to-digital converter and the second analog-to-digital converter before and after the variation can be kept constant.

With the first aspect, the first digital signal obtained by the analog-to-digital conversion by the first analog-to-digital converter can be corrected based on the four arithmetic operations using the parameter related to the variation amount of the second reference low voltage or the second reference low current. Further, the second digital signal obtained by the analog-to-digital conversion by the second analog-to-digital converter can be corrected based on the four arithmetic operations using the parameter related to the variation amount of the first reference low voltage or the first reference low current.

With the first aspect, the first reference low voltage or the first reference low current can be generated by stepping down the first reference voltage or the first reference current of the first reference power supply by using the active element or the passive element. Further, the second reference low voltage or the second reference low current can be generated by stepping down the second reference voltage or the second reference current of the second reference power supply by using the active element or the passive element.

With the first aspect, the first reference voltage or the first reference current of the first reference power supply can be generated by amplifying the first reference low voltage or the first reference low current of the first reference low power supply by using the active element. Further, the second reference voltage or the second reference current of the second reference power supply can be generated by amplifying the second reference low voltage or the second reference low current of the second reference low power supply by using the active element.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Figure 1:
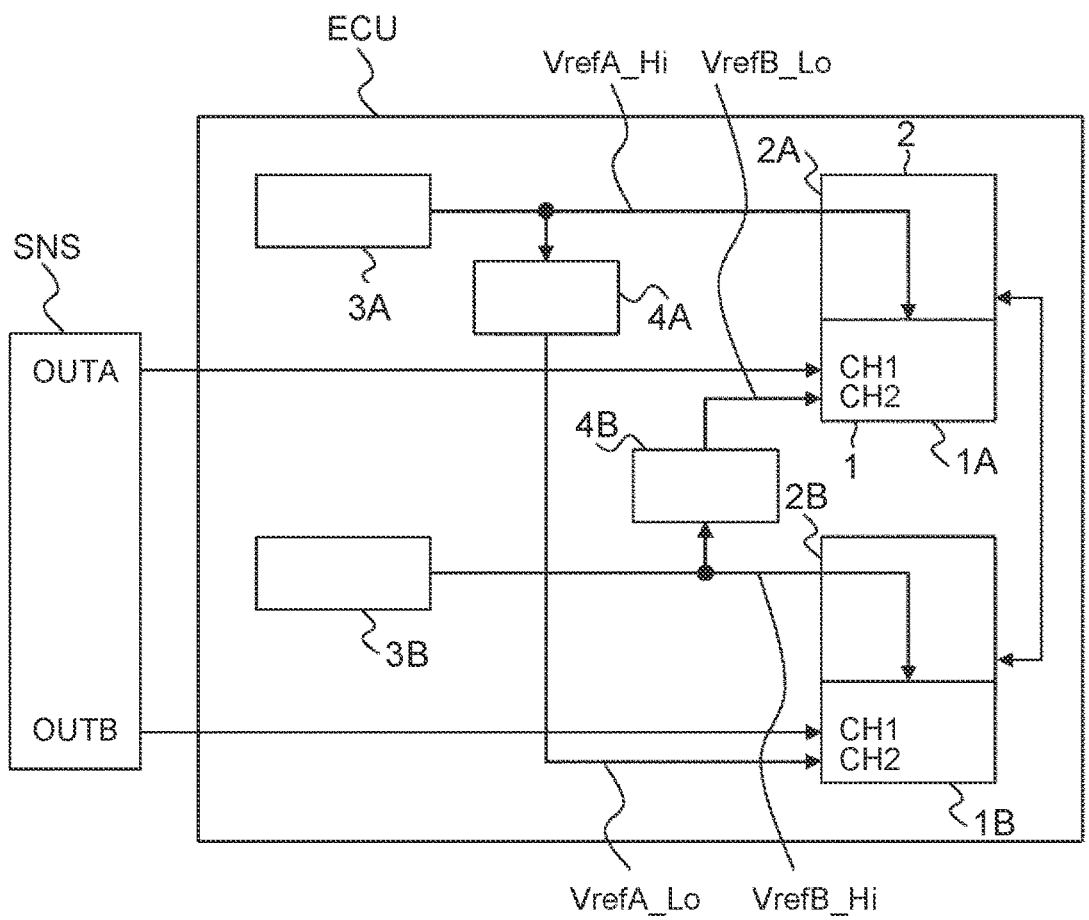
FIG. 1 is a block diagram showing a configuration example of an A/D conversion system according to an embodiment.

Hereinafter, an A/D conversion system (hereinafter simply referred to also as "system") according to an embodiment will be described with reference to the drawings. An A/D conversion method according to the embodiment is realized by computer processing to be performed in the system according to the embodiment. In the drawings, the same or corresponding parts are represented by the same reference signs to simplify or omit the description.

1. System Configuration Example

FIG. 1 is a block diagram showing a configuration example of the A/D conversion system according to the embodiment. In the example shown in FIG. 1, analog outputs OUTA and OUTB from a sensor SNS are input to and subjected to A/D conversion by an electronic control unit ECU (hereinafter simply referred to also as "control unit ECU"). The analog outputs OUTA and OUTB are, for example, analog voltage signals output from the sensor SNS. The analog outputs OUTA and OUTB are examples of "analog signals" in the present disclosure.

The sensor SNS includes, for example, various sensors mounted on a vehicle. Examples of the various sensors include an accelerator pedal sensor and a temperature sensor. In the example shown in FIG. 1, the sensor SNS is a single sensor. The sensor SNS may include two sensors that separately measure the physical quantity of the same object. In this case, the analog output OUTA is input to the control unit ECU from one sensor, and the analog output OUTB is input to the control unit ECU from the other sensor.

The control unit ECU includes an A/D converter 1A that performs A/D conversion of the analog output OUTA, and an A/D converter 1B that performs A/D conversion of the analog output OUTB. In the example shown in FIG. 1, the A/D converter 1A is built in a microcomputer 2A, and the A/D converter 1B is built in a microcomputer 2B. The microcomputers 2A and 2B are composed of integrated circuits, respectively. These microcomputers are connected by a wire, and communicate with each other via the wire.

The A/D converter 1A is an example of a "first A/D converter" in the present disclosure, and the A/D converter 1B is an example of a "second A/D converter" in the present disclosure. The microcomputer 2A is an example of a "first conversion device" in the present disclosure, and the microcomputer 2B is an example of a "second conversion device" in the present disclosure. When the A/D converters 1A and 1B are not particularly distinguished, they are hereinafter referred to collectively as "A/D converter 1". When the microcomputers 2A and 2B are not particularly distinguished, they are hereinafter referred to collectively as "microcomputer 2".

In the A/D conversion performed by the A/D converter 1A, the analog output OUTA is converted into a digital signal based on a reference voltage of a reference voltage source 3A. In the A/D conversion performed by the A/D converter 1B, the analog output OUTB is converted into a digital signal based on a reference voltage of a reference voltage source 3B. The reference voltage sources 3A and 3B are power supplies composed of, for example, integrated circuits and secondary batteries, respectively. The reference voltage source 3A is an example of a "first reference power supply" in the present disclosure. The reference voltage source 3B is an example of a "second reference power supply" in the present disclosure. When the reference voltage sources 3A and 3B are not particularly distinguished, they are hereinafter referred to collectively as "reference voltage source 3". The reference voltage of the reference voltage source 3A is an example of a "first reference voltage" in the present disclosure. The reference voltage of the reference voltage source 3B is an example of a "second reference voltage" in the present disclosure. The analog output OUTA is an example of a "first analog signal" in the present disclosure. The digital signal converted from the analog output OUTA is an example of a "first digital signal" in the present disclosure. The analog output OUTB is an example of a "second analog signal" in the present disclosure. The digital signal converted from the analog output OUTB is an example of a "second digital signal" in the present disclosure.

The reason why the reference voltage source 3 is the example of the "reference power supply" in the present disclosure is that a reference current source may be used instead of the reference voltage source 3. For example, when the analog outputs OUTA and OUTB are analog voltage signals output from the sensor SNS, these analog voltage signals can be converted into digital signals based on reference currents of the reference current sources. In another example, when the analog outputs OUTA and OUTB are analog current signals output from the sensor SNS, these analog current signals can be converted into digital signals based on the reference currents of the reference current sources. As described above, the combination of the reference power supply and the analog input signal need not be unified into either voltage or current. The reference voltage source 3 and the reference current source may be referred to collectively as "reference level generation source". The reference current of the reference voltage source 3A is an example of a "first reference current" in the present disclosure. The reference current of the reference voltage source 3B is an example of a "second reference current" in the present disclosure.

Figure 2:
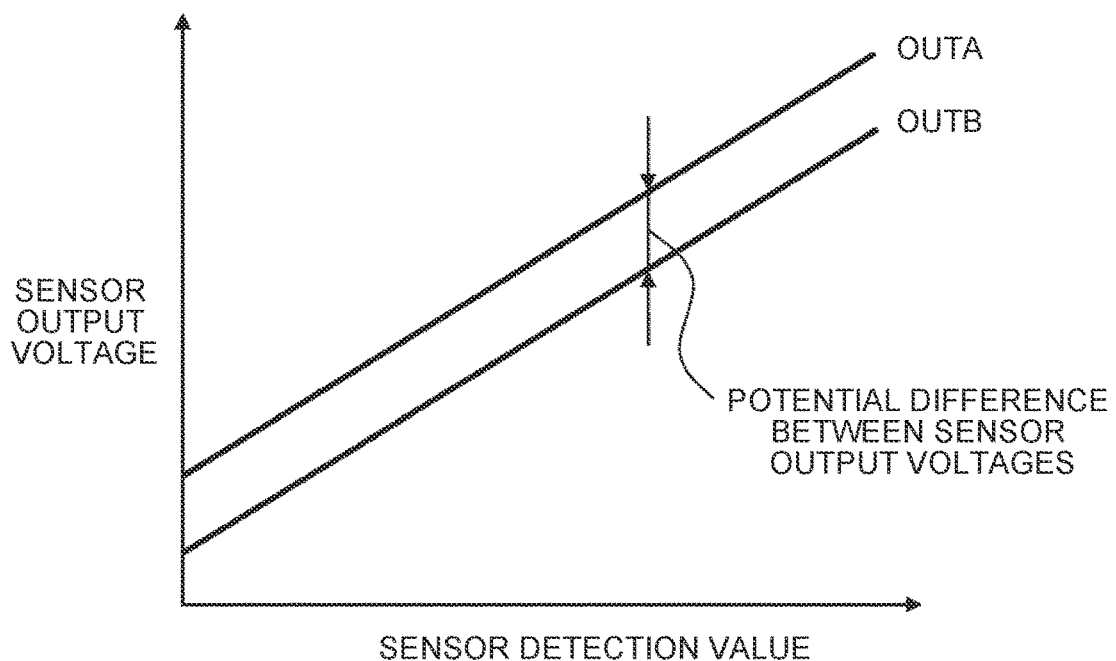
FIG. 2 is a diagram showing an example of a relationship between a physical quantity (sensor detection value) of a measurement target detected by a sensor SNS and each analog voltage signal (sensor output voltage) output from the sensor SNS.

The reference voltage of the reference voltage source 3A and the reference voltage of the reference voltage source 3B may be the same value or different values. The outputs of the sensor SNS detected by the A/D converters 1 may be designed to have the same output value or to have different output values. FIG. 2 is a diagram showing an example of a relationship between a physical quantity (sensor detection value) of a measurement target detected by the sensor SNS designed to output different values and each analog voltage signal (sensor output voltage) output from the sensor SNS. In the example shown in FIG. 2, the output voltages increase in proportion to the sensor detection value. In this example, the analog outputs OUTA and OUTB are designed to be different from each other. Therefore, there is a potential difference between these output voltages.

In the example shown in FIG. 1, a step-down circuit 4A is further provided between the reference voltage source 3A and the microcomputer 2B, and a step-down circuit 4B is further provided between the reference voltage source 3B and the microcomputer 2A. The step-down circuit 4A generates, from the reference voltage of the reference voltage source 3A, a reference voltage lower than this reference voltage (hereinafter referred to also as "reference low voltage"). The step-down circuit 4B generates a reference low voltage from the reference voltage of the reference voltage source 3B. The step-down circuit 4A is an example of a "first reference low power supply" in the present disclosure. The step-down circuit 4B is an example of a "second reference low power supply" in the present disclosure. When the step-down circuits 4A and 4B are not particularly distinguished, they are hereinafter referred to collectively as "step-down circuit 4".

For convenience of description, the reference voltage of the reference voltage source 3A is hereinafter referred to as "reference voltage VrefA_Hi", and the reference voltage of the reference voltage source 3B is hereinafter referred to as "reference voltage VrefB_Hi". The reference low voltage generated from the reference voltage VrefA_Hi in the step-down circuit 4A is referred to as "reference low voltage VrefA_Lo", and the reference low voltage generated from the reference voltage VrefB_Hi in the step-down circuit 4B is referred to as "reference low voltage VrefB_Lo". When the reference voltages VrefA_Hi and VrefB_Hi are not particularly distinguished, they are referred to collectively as "reference voltage Vref_Hi". When the reference low voltages VrefA_Lo and VrefB_Lo are not particularly distinguished, they are referred to collectively as "reference low voltage Vref_Lo".

Figure 3:
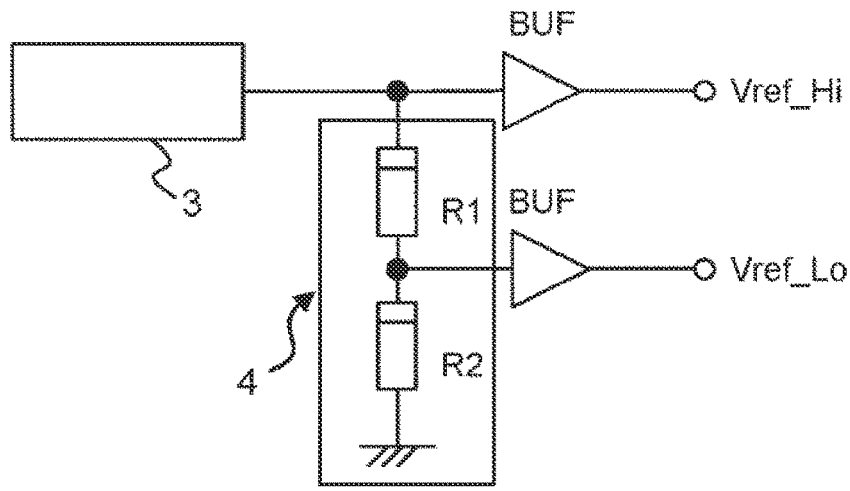
FIG. 3 is a diagram illustrating a first configuration example of a step-down circuit.

The step-down circuit 4 includes, for example, an active element or a passive element. FIG. 3 is a diagram illustrating a first configuration example of the step-down circuit 4. In the example shown in FIG. 3, the step-down circuit 4 includes resistors R1 and R2 that are passive elements. A buffer BUF is arbitrarily added depending on the configuration of the step-down circuit 4.

In this example, the reference voltage Vref_Hi of the reference voltage source 3 is divided in proportion to the values of the resistors R1 and R2. The reference low voltage Vref_Lo generated by the step-down circuit 4 is calculated by Expression (1) using the reference voltage Vref_Hi and the values of the resistors R1 and R2.

$$\text{Vref}_{Lo} = \frac{R2}{R1 + R2} \times \text{Vref\_Hi} \tag{1}$$

Figure 4:
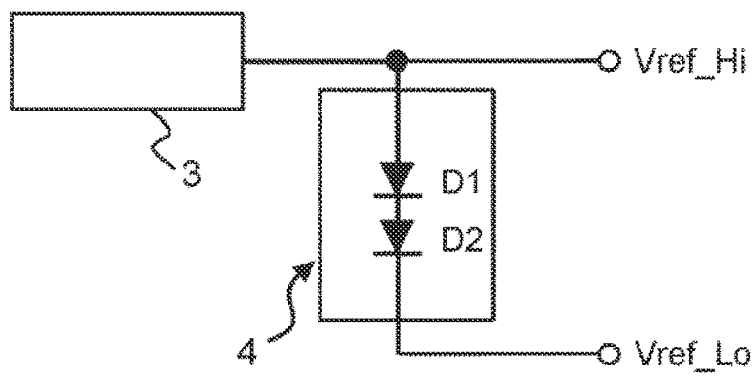
FIG. 4 is a diagram illustrating a second configuration example of the step-down circuit.

FIG. 4 is a diagram illustrating a second configuration example of the step-down circuit 4. In the example shown in FIG. 4, the step-down circuit 4 includes diodes D1 and D2 that are active elements. For example, the voltage drop characteristics of the diodes D1 and D2 are grasped in advance, and a coefficient is set based on these characteristics. Thus, the reference low voltage Vref_Lo can be generated from the reference voltage Vref_Hi of the reference voltage source 3.

Figure 5:
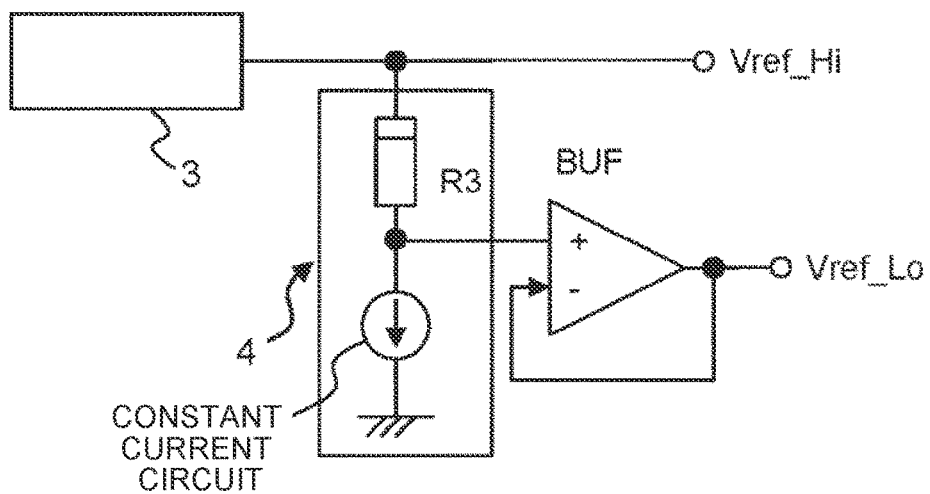
FIG. 5 is a diagram illustrating a third configuration example of the step-down circuit.

FIG. 5 is a diagram illustrating a third configuration example of the step-down circuit 4. In the example shown in FIG. 5, the step-down circuit 4 includes a resistor R3 that is a passive element and a constant current circuit. Examples of the constant current circuit include a constant current diode or a junction field effect transistor (FET). A buffer BUF is arbitrarily added depending on the configuration of the step-down circuit 4.

2. Features of Embodiment 2-1. Problem when Plurality of Reference Voltage Sources is Provided In the configuration example shown in FIG. 1, the two analog outputs OUTA and OUTB are input to the control unit ECU and subjected to A/D conversion by the two A/D converters 1, respectively. With such duplication, the soundness of the sensor SNS and the A/D converters 1 can be secured. In the case where the two A/D converters 1 refer to the two reference voltage sources individually, a variation between the reference voltage sources causes a relative deviation in the values after the A/D conversion unlike a case where the A/D converters 1 refer to one common reference voltage source.

The "relative deviation" herein means a difference between a value after the A/D conversion by one A/D converter 1 (for example, the A/D converter 1A) and a value after the A/D conversion by the other A/D converter (for example, the A/D converter 1B) under the assumption that the value after the A/D conversion by the one A/D converter 1 is correct. When the reference voltages used by the two A/D converters agree with each other, the relative deviation is calculated by subtracting the value after the A/D conversion by the other A/D converter 1 from the value after the A/D conversion by the one A/D converter 1. When the reference voltages used by the two A/D converters 1 do not agree with each other, the relative deviation is calculated by correcting one of the values after the A/D conversion by using the ratio between the reference voltages and subtracting the corrected value from the other value after the A/D conversion.

Figure 6:
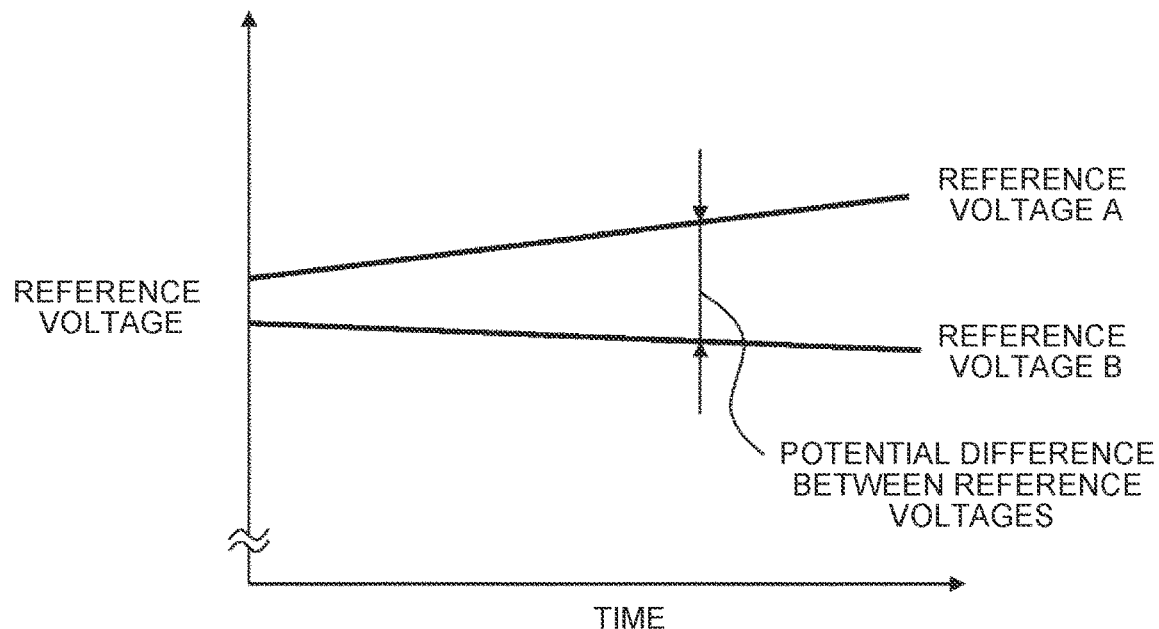
FIG. 6 is a diagram illustrating an example of time-series changes in reference voltages.

The reference voltage Vref_Hi of the reference voltage source 3 (or the reference current of the reference current source) drifts due to self-heating of a device including the reference voltage source 3 and transfer of heat to and from surrounding elements. FIG. 6 is a diagram illustrating an example of time-series changes in the reference voltages. In the example shown in FIG. 6, a reference voltage A (for example, the reference voltage VrefA_Hi) increases with an elapse of time, and a reference voltage B (for example, the reference voltage VrefB_Hi) decreases with the elapse of time. When such drift of the reference voltages Vref_Hi occurs, the potential difference between the reference voltages changes with time. Then, the relative deviation due to the A/D conversion using the two reference voltage sources also changes with time.

For this reason, the system according to the embodiment adopts the configuration (see FIG. 1) in which the reference low voltage Vref_Lo generated from the reference voltage Vref_Hi of one reference voltage source is input to the A/D converter 1 (microcomputer 2) that performs A/D conversion by referring to the reference voltage Vref_Hi of the other reference voltage source. The system according to the embodiment also calculates a parameter related to a variation amount of the reference low voltage Vref_Lo (variation parameter) in the microcomputer 2 to which the reference low voltage Vref_Lo is input. Then, the digital signal obtained by the A/D conversion by the A/D converter 1 is corrected by using the variation parameter.

2-2. Digital Signal Correction Example

Hereinafter, a digital signal correction example will be described using specific numerical values. The numerical values shown below are examples, and the present disclosure is not limited to these numerical values.

In this correction example, the quantization bit count is 10 bits, the reference voltage Vref_Hi of each reference voltage source 3 is 5.0 V, and the step-down ratio of the step-down circuit 4 is 0.8 (that is, each reference low voltage Vref_Lo is 4.0 V). In this correction example, the analog output OUTA is about 4.0 V and the analog output OUTB is about 3.0 V (that is, the potential difference between the sensor output voltages is about 1.0 V).

A value CH1 after the A/D conversion (A/D conversion value) by the A/D converter 1A using the reference voltage VrefA_Hi is represented by Expression (2), and a value CH2 after the A/D conversion (A/D conversion value) by the A/D converter 1A using the reference low voltage VrefB_Lo is represented by Expression (3).

$$CH1 \text{ [decimal]} = \frac{OUTA[V]}{\text{VrefA\_Hi}[V]} \times 2^{bit\ count\ [bit]} \tag{2}$$

$$= \frac{4[V]}{5[V]} \times 2^{10 \text{ [bit]}} = 819 \text{ [dec]}$$

$$CH2 \text{ [decimal]} = \frac{\text{VrefB\_Lo[V]}}{\text{VrefA\_Hi[V]}} \times 2^{bit \text{ count [bit]}} \quad (3)$$

$$= \frac{\text{VrefB\_Hi[V]} \times \begin{array}{c} \text{Resistance voltage} \\ \text{division ratio} \end{array}}{\text{VrefA\_Hi[V]}} \times 2^{bit \text{ count [bit]}}$$

$$= \frac{5[V] \times 0.8}{5[V]} \times 2^{10 \text{ [bit]}} = 819 \text{ [dec]}$$

A value CH1 after the A/D conversion (A/D conversion value) by the A/D converter 1B using the reference voltage VrefB_Hi is represented by Expression (4), and a value CH2 after the A/D conversion (A/D conversion value) by the A/D converter 1B using the reference low voltage VrefA_Lo is represented by Expression (5).

$$CH1 \text{ [decimal]} = \frac{\text{OUTA[V]}}{\text{VrefB\_Hi[V]}} \times 2^{bit \text{ count [bit]}} \quad (4)$$

$$= \frac{3[V]}{5[V]} \times 2^{10 \text{ [bit]}} = 614 \text{ [dec]}$$

$$CH2 \text{ [decimal]} = \frac{\text{VrefA\_Lo[V]}}{\text{VrefB\_Hi[V]}} \times 2^{bit \text{ count [bit]}} \quad (5)$$

$$= \frac{\text{VrefA\_Hi[V]} \times \begin{array}{c} \text{Resistance voltage} \\ \text{division ratio} \end{array}}{\text{VrefB\_Hi[V]}} \times 2^{bit \text{ count [bit]}}$$

$$= \frac{5[V] \times 0.8}{5[V]} \times 2^{10 \text{ [bit]}} = 819 \text{ [dec]}$$

When the A/D conversion results encoded by the A/D converter 1A are converted into analog values under the condition that a calculation reference voltage of the A/D converter 1A is 5 [V], values (analog conversion values) CH1 and CH2 shown in Expressions (6) and (7) are obtained.

$$CH1[V] = \frac{CH1 \text{ [dec]}}{2^{bit \text{ count [bit]}} - 1} \times \text{Calculation reference voltage [V]} \quad (6)$$

$$= \frac{819 \text{ [dec]}}{2^{10 \text{ [bit]}} - 1} \times 5[V] = 4.00[V]$$

$$CH2[V] = \frac{CH2 \text{ [dec]}}{2^{bit \text{ count [bit]}} - 1} \times \text{Calculation reference voltage [V]} \quad (7)$$

$$= \frac{819 \text{ [dec]}}{2^{10 \text{ [bit]}} - 1} \times 5[V] = 4.00[V]$$

When the A/D conversion results encoded by the A/D converter 1B are converted into analog values under the condition that a calculation reference voltage of the A/D converter 1B is 5 [V], values (analog conversion values) CH1 and CH2 shown in Expressions (8) and (9) are obtained.

$$CH1[V] = \frac{CH1 \text{ [dec]}}{2^{bit \text{ count [bit]}} - 1} \times \text{Calculation reference voltage [V]} \quad (8)$$

$$= \frac{614 \text{ [dec]}}{2^{10 \text{ [bit]}} - 1} \times 5[V] = 3.00[V]$$

$$CH2[V] = \frac{CH2 \text{ [dec]}}{2^{bit \text{ count [bit]}} - 1} \times \text{Calculation reference voltage [V]} \quad (9)$$

$$= \frac{819 \text{ [dec]}}{2^{10 \text{ [bit]}} - 1} \times 5[V] = 4.00[V]$$

Assuming that the reference voltage VrefB_Hi varies from 5.0 V to 4.5 V due to drift, the A/D conversion values CH1 and CH2 are calculated again. The A/D conversion values CH1 and CH2 corresponding to Expressions (2) and (3) are represented by Expressions (10) and (11), respectively.

$$CH1 \text{ [decimal]} = \frac{\text{OUTA[V]}}{\text{VrefA\_Hi[V]}} \times 2^{bit \text{ count [bit]}} \quad (10)$$

$$= \frac{4[V]}{5[V]} \times 2^{10 \text{ [bit]}} = 819 \text{ [dec]}$$

$$CH2 \text{ [decimal]} = \frac{\text{VrefB\_Lo[V]}}{\text{VrefA\_Hi[V]}} \times 2^{bit \text{ count [bit]}} \quad (11)$$

$$= \frac{\text{VrefB\_Hi[V]} \times \begin{array}{c} \text{Resistance voltage} \\ \text{division ratio} \end{array}}{\text{VrefA\_Hi[V]}} \times 2^{bit \text{ count [bit]}}$$

$$= \frac{4.5[V] \times 0.8}{5[V]} \times 2^{10 \text{ bit}} = 737 \text{ [dec]}$$

The A/D conversion values CH1 and CH2 corresponding to Expressions (4) and (5) are represented by Expressions (12) and (13), respectively.

$$CH1 \text{ [decimal]} = \frac{\text{OUTB[V]}}{\text{VrefB\_Hi[V]}} \times 2^{bit \text{ count [bit]}} \quad (12)$$

$$= \frac{3[V]}{4.5[V]} \times 2^{10 \text{ [bit]}} = 683 \text{ [dec]}$$

$$CH2 \text{ [decimal]} = \frac{\text{VrefA\_Lo[V]}}{\text{VrefB\_Hi[V]}} \times 2^{bit \text{ count [bit]}} \quad (13)$$

$$= \frac{\text{VrefA\_Hi[V]} \times \begin{array}{c} \text{Resistance voltage} \\ \text{division ratio} \end{array}}{\text{VrefB\_Hi[V]}} \times 2^{bit \text{ count [bit]}}$$

$$= \frac{5[V] \times 0.8}{4.5[V]} \times 2^{10 \text{ [bit]}} = 910 \text{ [dec]}$$

When the A/D conversion results encoded by the A/D converter 1A are converted into analog values under the condition that the calculation reference voltage of the A/D converter 1A is 5 [V], values (analog conversion values) CH1 and CH2 shown in Expressions (14) and (15) are obtained.

$$CH1[V] = \frac{CH1 \text{ [dec]}}{2^{bit \text{ count [bit]}} - 1} \times \text{Calculation reference voltage [V]} \quad (14)$$

$$= \frac{819 \text{ [dec]}}{2^{10 \text{ [bit]}} - 1} \times 5[V] = 4.00[V]$$

$$CH2[V] = \frac{CH2 \text{ [dec]}}{2^{bit \text{ count [bit]}} - 1} \times \text{Calculation reference voltage [V]} \quad (15)$$

$$= \frac{737 \text{ [dec]}}{2^{10 \text{ [bit]}} - 1} \times 5[V] = 3.60[V]$$

When the A/D conversion results encoded by the A/D converter 1B are converted into analog values under the condition that the calculation reference voltage of the A/D converter 1B is 5 [V], values (analog conversion values) CH1 and CH2 shown in Expressions (16) and (17) are obtained.

$$CH1[V] = \frac{CH1\ [dec]}{2^{bit\ count\ [bit]} - 1} \times \text{Calculation reference voltage [V]} \quad (16)$$

$$= \frac{683\ [dec]}{2^{10\ [bit]} - 1} \times 5[V] = 3.34[V]$$

$$CH2[V] = \frac{CH2\ [dec]}{2^{bit\ count\ [bit]} - 1} \times \text{Calculation reference voltage [V]} \quad (17)$$

$$= \frac{910\ [dec]}{2^{10\ [bit]} - 1} \times 5[V] = 4.45[V]$$

Comparing the analog conversion values CH1 shown in Expressions (6) and (8), it is understood that the difference in the analog conversion values CH1 between the A/D converter 1A and the A/D converter 1B before the variation in the reference voltage VrefB_Hi (that is, an A/D conversion value of the potential difference between the sensor output voltages) is about 1.0 V (=4.00 V−3.00 V). This agrees with the difference between the analog output OUTA and the analog output OUTB before the A/D conversion (that is, the potential difference between the sensor output voltages). Comparing the analog conversion values CH1 shown in Expressions (14) and (16), however, it is understood that the difference in the analog conversion values CH1 after the variation in the reference voltage VrefB_Hi changes to about 0.67 V (=4.00 V−3.34 V).

Thus, when the reference voltage VrefB_Hi varies, the difference in the analog conversion values CH1 between the two A/D converters 1 changes. The change in the difference in the analog conversion values CH1 may occur due to a factor other than drift, and may occur even when the reference voltage VrefA_Hi varies. In the embodiment, a focus is put on the analog conversion value CH2 calculated based on the A/D conversion value obtained by the A/D conversion with reference to the reference low voltage Vref_Lo, and the ratio between the analog conversion value CH2 at a certain timing and the analog conversion value CH2 at a timing before this timing is calculated as a "variation parameter VP".

The variation parameter VP is calculated by the microcomputer 2A or 2B. The variation parameter VP calculated by the microcomputer 2A is hereinafter referred to as "variation parameter VP1". The variation parameter VP1 is calculated by Expression (18) using the analog conversion values CH2 shown in Expressions (7) and (15).

$$VP1 = \frac{CH2\ \text{after variation [V]}}{CH2\ \text{before variation [V]}} \quad (18)$$

$$= \frac{3.60[V]}{4.00[V]} = 0.9$$

That is, the analog conversion value CH2 after the variation in the reference voltage VrefB_Hi is 10% lower than that before the variation. When the variation parameter VP1 is calculated, the microcomputer 2A calculates a value CH1 after the A/D conversion (A/D conversion value) by the A/D converter 1B by Expression (19) under the assumption that the reference voltage VrefB_Hi referred to by the reference voltage source 3B decreases by 10%.

$$CH1\ [\text{decimal}] = \frac{OUTB[V]}{\text{VrefB\_Hi}_{after\ variation\ [V]} \times 0.9} \times 2^{bit\ count\ [bit]} \quad (19)$$

$$= \frac{3[V]}{4.5[V] \times 0.9} \times 2^{10\ [bit]} = 819\ [dec]$$

The A/D conversion value CH1 shown in Expression (19) can also be calculated by the microcomputer 2B. In this case, the same method as that in the calculation of the variation parameter VP1 performed by the microcomputer 2A is applied. The variation parameter VP calculated by the microcomputer 2B is hereinafter referred to as "variation parameter VP2". The variation parameter VP2 is calculated by Expression (20) using the analog conversion values CH2 shown in Expressions (9) and (17).

$$VP2 = \frac{CH2\ \text{after variation [V]}}{CH2\ \text{before variation [V]}} \quad (20)$$

$$= \frac{4.45[V]}{4.00[V]} = 1.1125$$

That is, the analog conversion value CH2 after the variation in the reference voltage VrefB_Hi is 11.25% higher than that before the variation. When the variation parameter VP2 is calculated, the microcomputer 2B calculates a value CH1 after the A/D conversion (A/D conversion value) by the A/D converter 1B by Expression (21) under the assumption that the reference voltage VrefB_Hi referred to by the reference voltage source 3B increases by 11.25%.

$$CH1\ [\text{decimal}] = \frac{OUTB[V]}{\text{VrefB\_Hi}_{after\ variation\ [V]} \times 1.1125} \times 2^{bit\ count\ [bit]} \quad (21)$$

$$= \frac{3[V]}{4.5[V] \times 1.125} \times 2^{10\ [bit]} = 614\ [dec]$$

The A/D conversion value shown in Expression (19) agrees with that shown in Expression (2), and the A/D conversion value shown in Expression (21) agrees with that shown in Expression (4). Thus, it is understood that the variation in the reference voltage VrefB_Hi (variation from 5.0 V to 4.5 V) is canceled by calculating the variation parameter VP and applying the variation parameter VP to the A/D conversion value. In Expressions (19) and (21), the value CH1 after the A/D conversion (A/D conversion value) by the A/D converter 1B is calculated by multiplying the reference voltage VrefB_Hi by the variation parameter VP1. The value CH1 after the A/D conversion (A/D conversion value) by the A/D converter 1B may be calculated by using the four arithmetic operations excluding multiplication, that is, addition, subtraction, and division.

The above description is directed to the digital signal correction example in the case of variation in the reference voltage VrefB_Hi. Even in a case of variation in the reference voltage VrefA_Hi, the value CH1 after the A/D conversion (A/D conversion value) by the A/D converter 1A can be corrected by the same method. Even in a case of variation in the reference voltages VrefA_Hi and VrefB_Hi, the values CH1 after the A/D conversion (A/D conversion values) by the A/D converters 1A and 1B can be corrected by the same method.

Examples of the timing to correct the A/D conversion value CH1 based on the variation parameter VP include a time when power is turned ON. However, the timing of correction is not limited to this timing. That is, the correction may be repeated every time a predetermined period elapses after the power is turned ON, or every time the vehicle including the control unit ECU travels a predetermined distance. The correction may be performed at a timing when the temperature of the device including the reference voltage source 3 exceeds a threshold, or at a timing when the variation parameter VP exceeds a threshold. The correction may be performed at a timing when a specific conversion result such as a potential difference between the sensor output voltages exceeds a threshold, or at a timing when this conversion result falls below the threshold.

3. Effects of Embodiment

With the embodiment described above, the reference low voltage Vref_Lo generated from the reference voltage Vref_Hi used by one of the two A/D converters 1 is input to the other A/D converter 1, and the variation parameter VP is calculated. Then, the value after the A/D conversion (A/D conversion value) by at least one of the two A/D converters 1 is corrected based on the variation parameter VP. Therefore, even in the case of variation in the reference voltage Vref_Hi, the relative deviation in the A/D conversion values between the two A/D converters 1 before and after the variation can be kept constant. Thus, it is possible to secure the reliability of the A/D conversion values obtained by the two A/D converters 1.

Components of a high-accuracy reference voltage source are expensive. For example, the high-accuracy reference voltage source is used as the reference voltage source 3A, a medium-accuracy reference voltage source using inexpensive components is used as the reference voltage source 3B, and the reference voltage of the reference voltage source 3A is assumed to be correct. With this configuration, it is possible to cancel the variation in the reference voltage Vref_Hi of the reference voltage source 3B. With the embodiment, it is possible to secure the reliability of the A/D conversion value obtained by the medium-accuracy A/D converter 1B while reducing the cost required for the system configuration.

With the embodiment, there is an advantage that the switching of the reference voltages of the sensor is not necessary unlike the related art (JP 2019-54433 A). There is also an advantage that the input impedance of the A/D converter, from the outside, is not limited.

4. Modifications

The system according to the embodiment described above can be modified as follows, for example.

4-1. Second Configuration Example of A/D Conversion System

Figure 7:
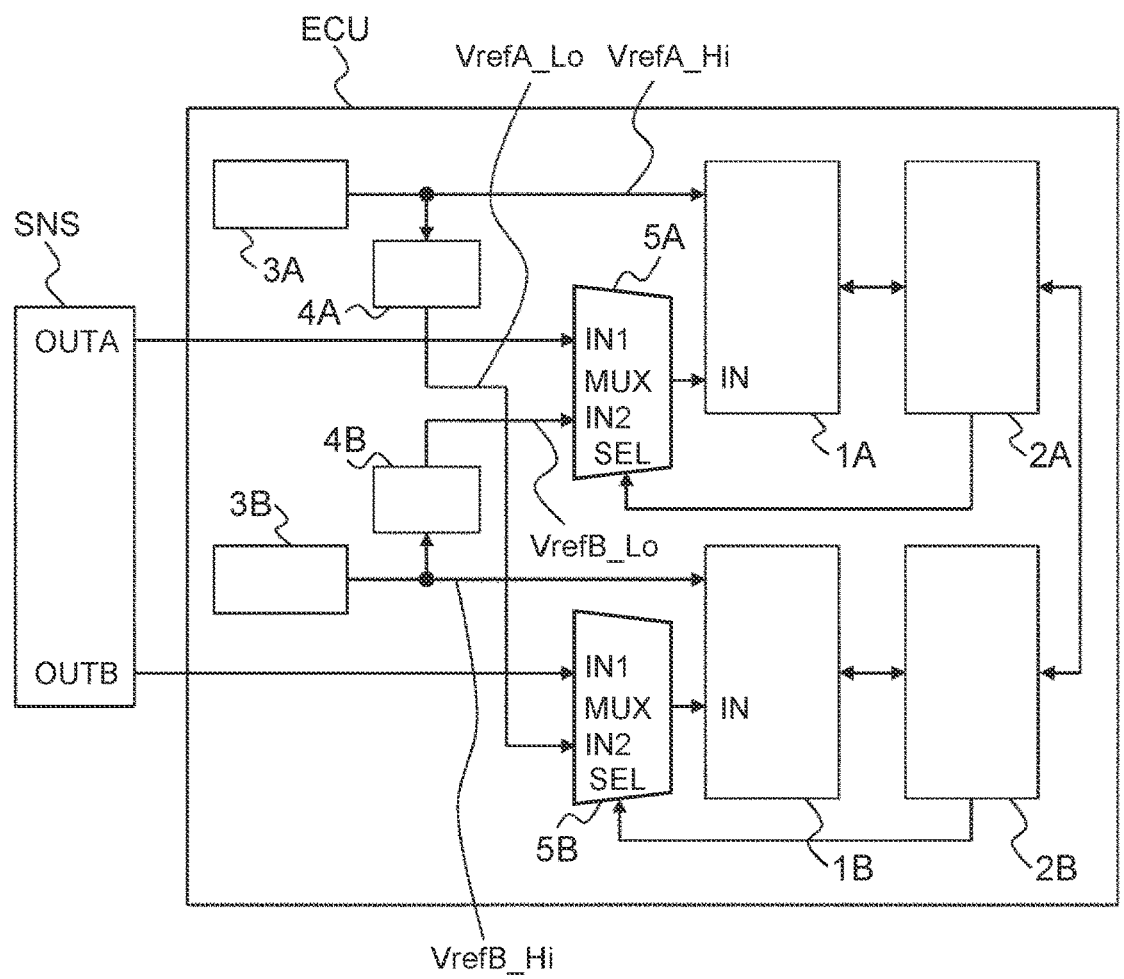
FIG. 7 is a block diagram showing a second configuration example of the A/D conversion system according to the embodiment.

FIG. 7 is a block diagram showing a second configuration example of the A/D conversion system according to the embodiment. In the example shown in FIG. 7, wires are provided between the A/D converter 1A and the microcomputer 2A, and between the A/D converter 1B and the microcomputer 2B. In the example shown in FIG. 7, multiplexers 5A and 5B are also provided.

The analog output OUTA and the reference low voltage VrefB_Lo are input to the multiplexer 5A. The multiplexer 5A inputs the analog output OUTA and the reference low voltage VrefB_Lo to the A/D converter 1A in response to a CH selection command from the microcomputer 2A. The analog output OUTB and the reference low voltage VrefA_Lo are input to the multiplexer 5B. The multiplexer 5B inputs the analog output OUTB and the reference low voltage VrefA_Lo to the A/D converter 1B in response to a CH selection command from the microcomputer 2B.

4-2. Third Configuration Example of A/D Conversion System

Figure 8:
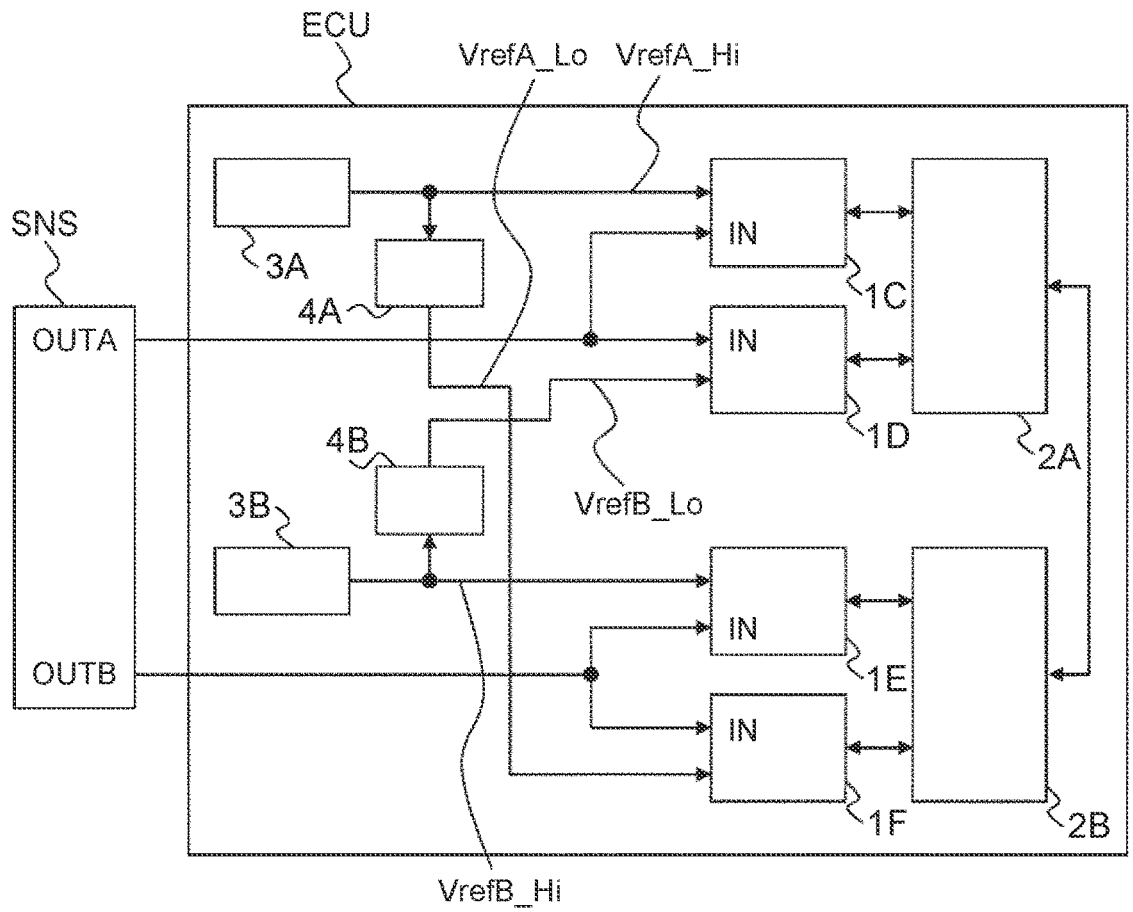
FIG. 8 is a block diagram showing a third configuration example of the A/D conversion system according to the embodiment.

FIG. 8 is a block diagram showing a third configuration example of the A/D conversion system according to the embodiment. In the example shown in FIG. 8, a total of four A/D converters 1C to 1F are provided. In the example shown in FIG. 8, wires are provided between the A/D converter 1C and the microcomputer 2A, between the A/D converter 1D and the microcomputer 2A, between the A/D converter 1E and the microcomputer 2B, and between the A/D converter 1F and the microcomputer 2B.

The analog output OUTA and the reference voltage VrefA_Hi are input to the A/D converter 1C. The A/D converter 1C performs A/D conversion of the analog output OUTA by referring to the reference voltage VrefA_Hi. The analog output OUTA and the reference low voltage VrefB_Lo are input to the A/D converter 1D. The A/D converter 1D performs A/D conversion of the analog output OUTA by referring to the reference low voltage VrefB_Lo.

The analog output OUTB and the reference voltage VrefB_Hi are input to the A/D converter 1E. The A/D converter 1E performs A/D conversion of the analog output OUTB by referring to the reference voltage VrefB_Hi. The analog output OUTB and the reference low voltage VrefA_Lo are input to the A/D converter 1F. The A/D converter 1F performs A/D conversion of the analog output OUTB by referring to the reference low voltage VrefA_Lo.

4-3. Fourth Configuration Example of A/D Conversion System

Figure 9:
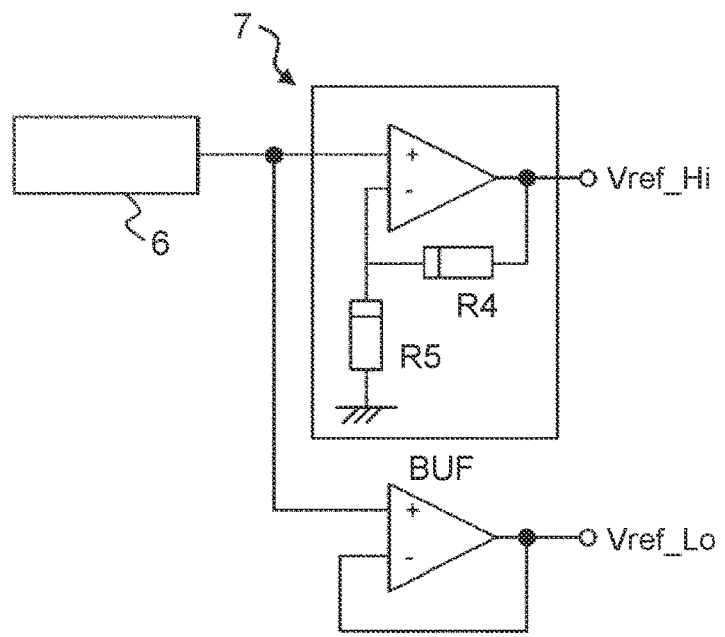
FIG. 9 is a block diagram illustrating a part of a fourth configuration example of the A/D conversion system according to the embodiment.

FIG. 9 is a block diagram illustrating a part of a fourth configuration example of the A/D conversion system according to the embodiment. In the configuration example shown in FIG. 1, the reference low voltage Vref_Lo is generated from the reference voltage Vref_Hi of the reference voltage source 3 by the combination of the reference voltage source 3 and the step-down circuit 4. In the fourth configuration example, the two types of reference voltage described in the first to third configuration examples are generated by a combination of a reference low voltage source 6 and a step-up circuit 7.

The reference low voltage source 6 is a power supply composed of, for example, an integrated circuit and a secondary battery. Two reference low voltage sources 6 are provided, for example, in conjunction with the two A/D converters 1 shown in FIG. 1. The step-up circuit 7 includes, for example, an operational amplifier that is an active element. Similarly to the reference low voltage sources 6, two step-up circuits 7 are provided in conjunction with the two A/D converters 1 shown in FIG. 1. The step-up circuit 7 generates, from the reference voltage of the reference low voltage source 6, a reference voltage higher than this reference voltage. That is, according to the combination of the reference low voltage source 6 and the step-up circuit 7, a reference voltage corresponding to the reference voltage Vref_Hi is generated from the reference voltage corresponding to the reference low voltage Vref_Lo.

In the fourth configuration example, the two reference low voltage sources 6 are examples of "first and second reference low power supplies" in the present disclosure. The two step-up circuits 7 are examples of "first and second reference power supplies" in the present disclosure.

What is claimed is:

1. An analog-to-digital conversion system configured to perform a plurality of analog-to-digital conversions in parallel by using a plurality of analog-to-digital converters that include different reference voltages, the analog-to-digital conversion system comprising:
- a first conversion device configured to communicate with a first analog-to-digital converter configured to convert a first analog signal into a first digital signal based on a first reference voltage or a first reference current, the first reference voltage and the first reference current being output from a first reference power supply;
- a second conversion device configured to communicate with a second analog-to-digital converter configured to convert a second analog signal into a second digital signal based on a second reference voltage or a second reference current, the second reference voltage and the second reference current being output from a second reference power supply;
- a first reference low power supply configured to input, to the second analog-to-digital converter, a first reference low voltage or a first reference low current lower than the first reference voltage or the first reference current; and
- a second reference low power supply configured to input, to the first analog-to-digital converter, a second reference low voltage or a second reference low current lower than the second reference voltage or the second reference current, wherein:
- the first conversion device is configured to correct the first digital signal, based on a variation amount of the second reference low voltage or the second reference low current; and
- the second conversion device is configured to correct the second digital signal, based on a variation amount of the first reference low voltage or the first reference low current.

2. The analog-to-digital conversion system according to claim 1, wherein:
- the first conversion device is configured to correct the first digital signal to cancel the variation amount of the second reference low voltage or the second reference low current; and
- the second conversion device is configured to correct the second digital signal to cancel the variation amount of the first reference low voltage or the first reference low current.

3. The analog-to-digital conversion system according to claim 2, wherein:
- the first digital signal is corrected based on four arithmetic operations using a parameter related to the variation amount of the second reference low voltage or the second reference low current; and
- the second digital signal is corrected based on four arithmetic operations using a parameter related to the variation amount of the first reference low voltage or the first reference low current.

4. The analog-to-digital conversion system according to claim 1, wherein:
- the first reference low power supply is configured to generate the first reference low voltage or the first reference low current by stepping down the first reference voltage or the first reference current by using an active element or a passive element connected to the first reference power supply; and
- the second reference low power supply is configured to generate the second reference low voltage or the second reference low current by stepping down the second reference voltage or the second reference current of the second reference power supply by using an active element or a passive element connected to the second reference power supply.

5. The analog-to-digital conversion system according to claim 1, wherein:
- the first reference voltage or the first reference current is generated by amplifying the first reference low voltage or the first reference low current by using an active element connected to the first reference low power supply; and
- the second reference voltage or the second reference current is generated by amplifying the second reference low voltage or the second reference low current by using an active element connected to the second reference low power supply.

6. An analog-to-digital conversion method for performing a plurality of analog-to-digital conversions in parallel by using a plurality of analog-to-digital converters that include different reference voltages, the analog-to-digital converters including a first analog-to-digital converter and a second analog-to-digital converter each configured to convert an analog signal into a digital signal, the analog-to-digital conversion method comprising:
- correcting a second digital signal obtained by analog-to-digital conversion by the second analog-to-digital converter, based on a variation amount of a first reference low voltage or a first reference low current lower than a first reference voltage or a first reference current referred to during analog-to-digital conversion by the first analog-to-digital converter; and
- correcting a first digital signal obtained by the analog-to-digital conversion by the first analog-to-digital converter, based on a variation amount of a second reference low voltage or a second reference low current lower than a second reference voltage or a second reference current referred to during the analog-to-digital conversion by the second analog-to-digital converter.

* * * * *